(12) United States Patent
Hiroi

(10) Patent No.: US 10,914,451 B2
(45) Date of Patent: Feb. 9, 2021

(54) OPTICAL UNIT AND OPTICAL APPARATUS

(71) Applicant: Masaki Hiroi, Miyagi (JP)

(72) Inventor: Masaki Hiroi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/256,024

(22) Filed: Jan. 24, 2019

(65) Prior Publication Data

US 2019/0242548 A1 Aug. 8, 2019

(30) Foreign Application Priority Data

Feb. 7, 2018 (JP) .................................. 2018-020524
Oct. 26, 2018 (JP) .................................. 2018-202108

(51) Int. Cl.
*F21V 5/00* (2018.01)
*G02B 27/09* (2006.01)
*F21K 9/60* (2016.01)
*G02B 7/02* (2006.01)
*H04N 5/349* (2011.01)
(Continued)

(52) U.S. Cl.
CPC ................ *F21V 5/007* (2013.01); *F21K 9/60* (2016.08); *G02B 7/021* (2013.01); *G02B 27/0961* (2013.01); *H01S 5/00* (2013.01); *H01S 5/02252* (2013.01); *H01S 5/02469* (2013.01); *H01S 5/423* (2013.01); *H04N 5/349* (2013.01); *F21Y 2105/12* (2016.08); *H01S 3/09415* (2013.01); *H01S 3/094053* (2013.01); *H01S 5/005* (2013.01); *H01S 5/02208* (2013.01); *H01S 5/02284* (2013.01); *H01S 5/02288* (2013.01)

(58) Field of Classification Search
CPC combination set(s) only.
See application file for complete search history.

(56) References Cited

U.S. PATENT DOCUMENTS

2005/0001896 A1* 1/2005 Wakisaka ............. G02B 3/0075
347/241
2005/0072981 A1* 4/2005 Suenaga .................. H01L 33/58
257/88
(Continued)

FOREIGN PATENT DOCUMENTS

JP  2009-176947       8/2009
JP  2016-195330    * 11/2015 ............. H01L 23/02
(Continued)

*Primary Examiner* — Zandra V Smith
*Assistant Examiner* — Andre C Stevenson
(74) *Attorney, Agent, or Firm* — IPUSA, PLLC

(57) ABSTRACT

An optical unit includes an optical module that includes a light emitting element array in which a plurality of light emitting elements are arranged, a lens array disposed facing the light emitting element array on an optical path of light emitted from the plurality of light emitting elements, and a fixing part configured to fix the light emitting element array to the lens array. The optical unit also includes a member configured to have a larger coefficient of thermal expansion than a coefficient of thermal expansion of the light emitting element array and a fastening part configured to fasten the optical module on a surface of the member. The fastening part is configured to fasten the optical module so as to enable expanding and contracting in a plane parallel to the surface of the member.

14 Claims, 15 Drawing Sheets

(51) Int. Cl.
*H01S 5/024* (2006.01)
*H01S 5/42* (2006.01)
*H01S 5/022* (2006.01)
*H01S 5/00* (2006.01)
*F21Y 105/12* (2016.01)
*H01S 3/094* (2006.01)
*H01S 3/0941* (2006.01)
*H01S 5/02208* (2021.01)

(56) References Cited

U.S. PATENT DOCUMENTS

| | | | |
|---|---|---|---|
| 2008/0036103 A1* | 2/2008 | Ban | G02B 6/4246 264/1.25 |
| 2009/0190319 A1 | 7/2009 | Hatakeyama | |
| 2010/0201778 A1* | 8/2010 | Nomura | B41J 2/45 347/241 |
| 2018/0182928 A1* | 6/2018 | Namie | H01L 25/0753 |

FOREIGN PATENT DOCUMENTS

| | | |
|---|---|---|
| JP | 2016-111133 | 6/2016 |
| JP | 2017-092287 | 5/2017 |
| JP | 2017-204541 | 11/2017 |
| JP | 2018-152454 | 9/2018 |

\* cited by examiner

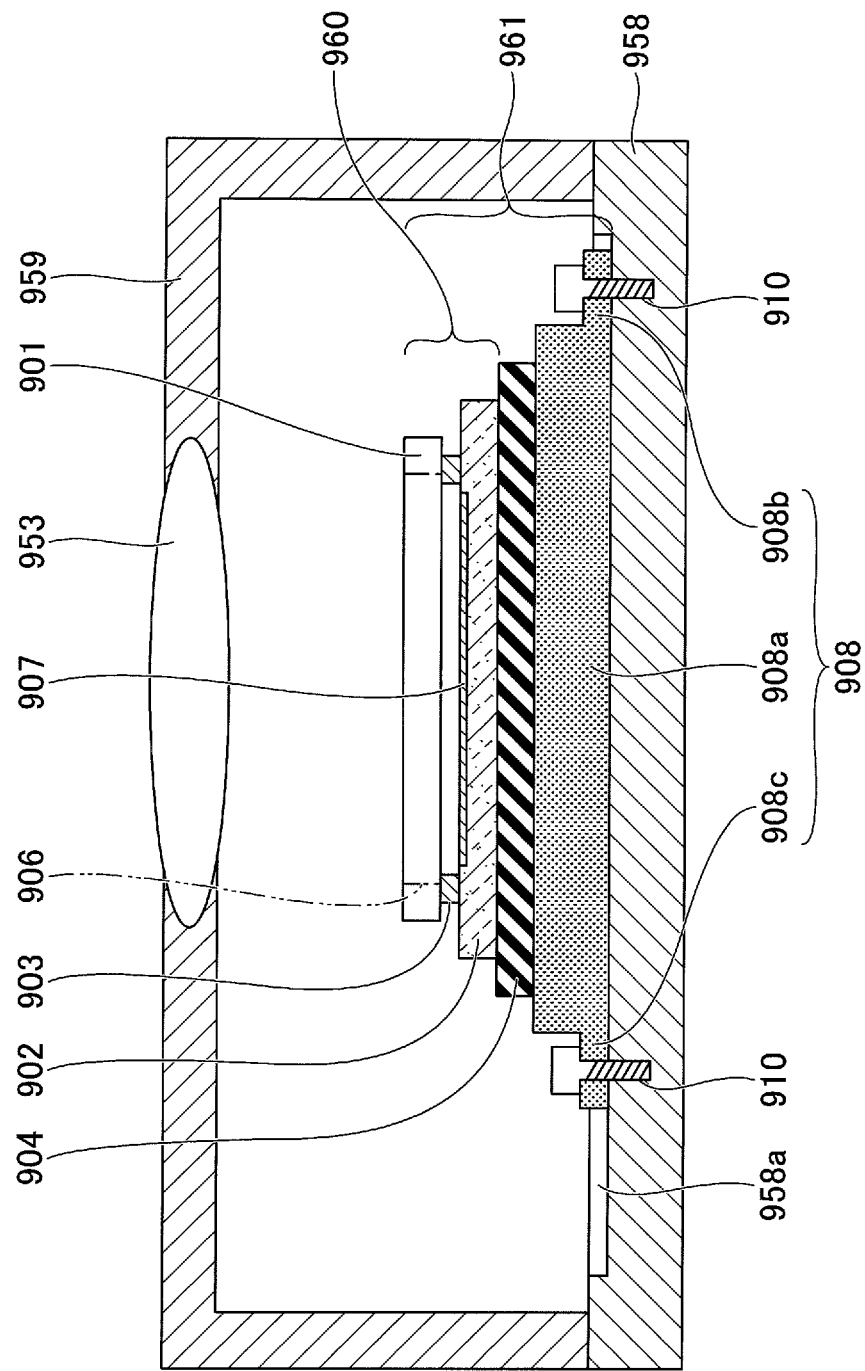

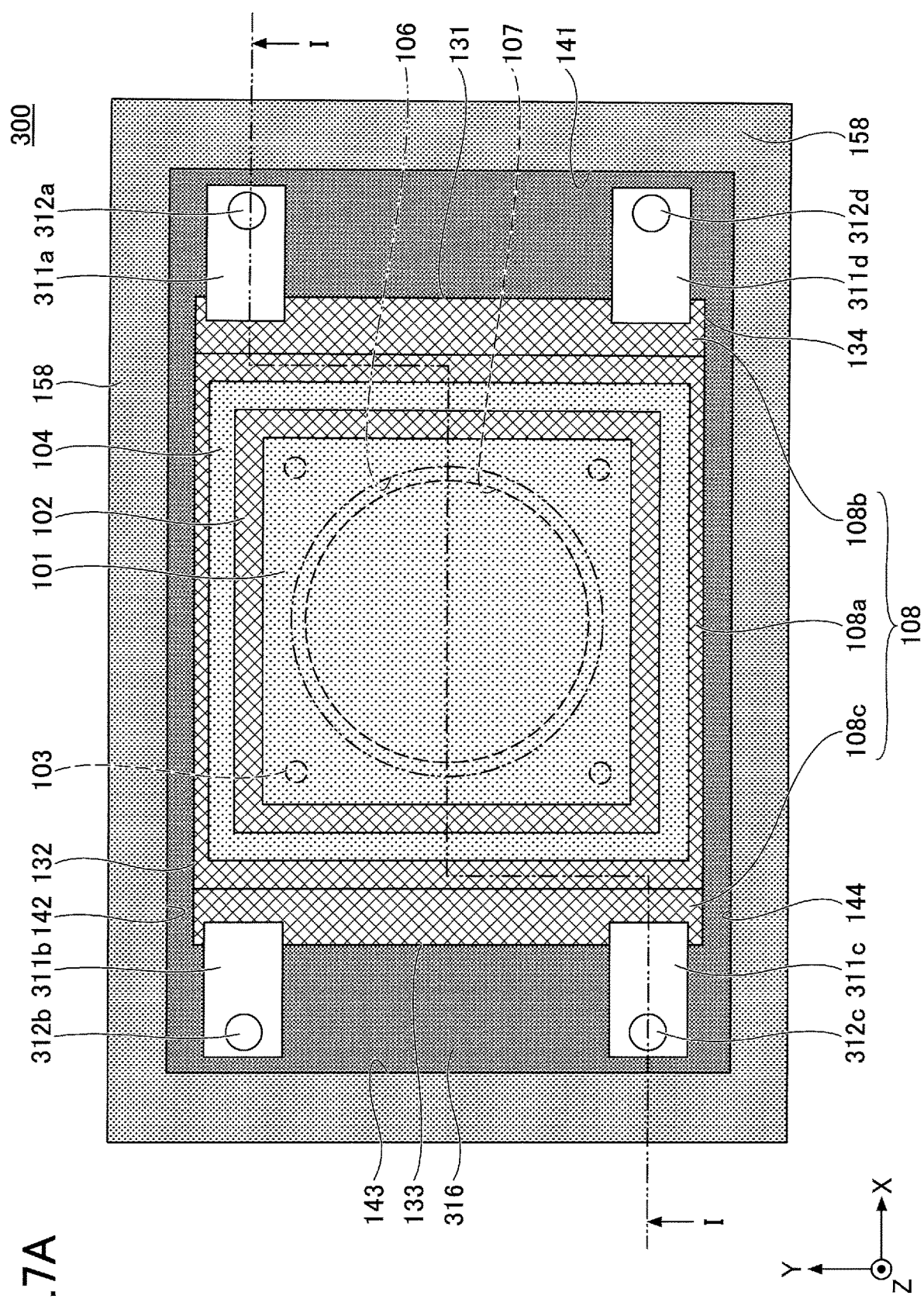

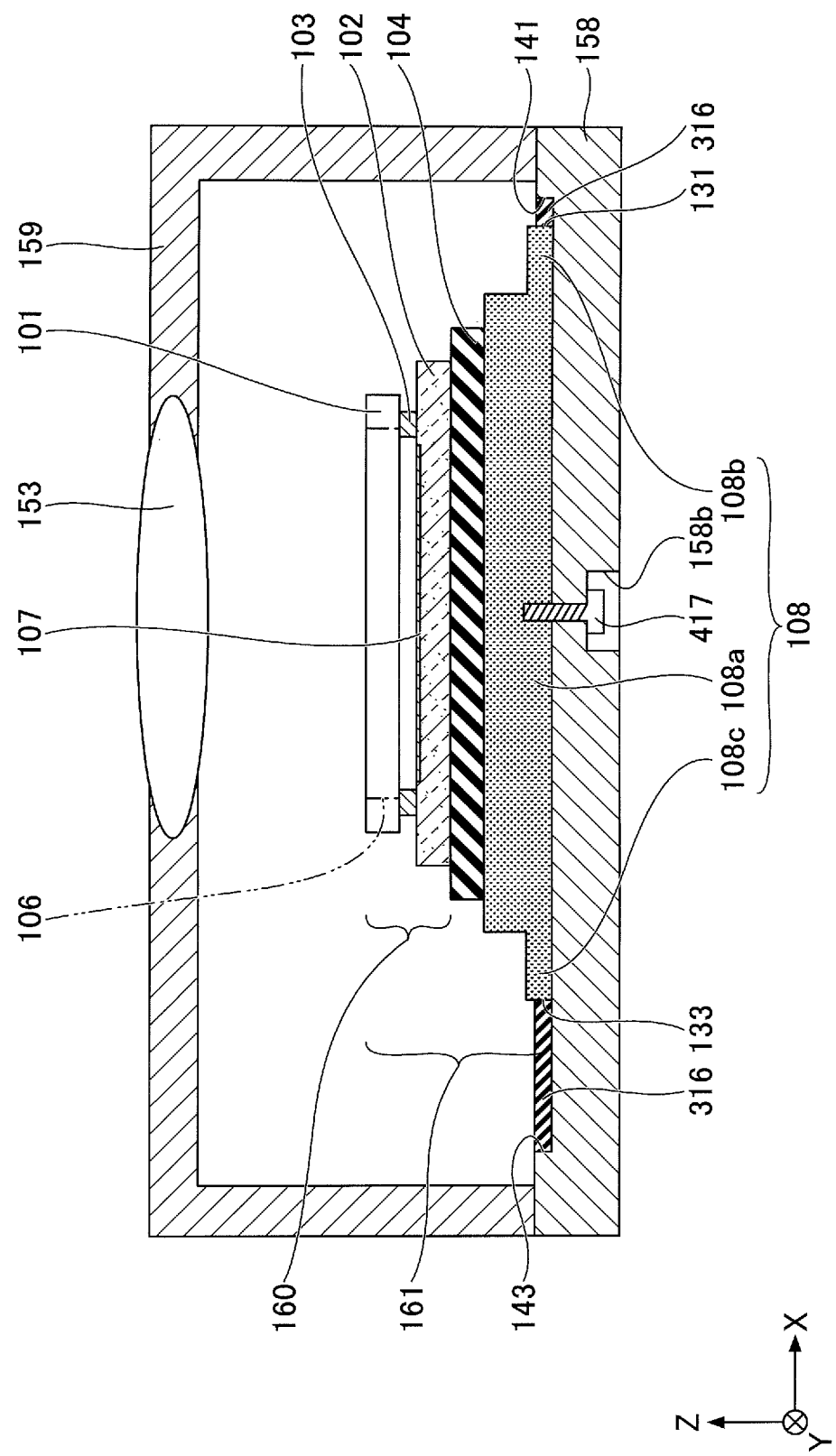

US 10,914,451 B2

OPTICAL UNIT AND OPTICAL APPARATUS

CROSS-REFERENCE TO RELATED APPLICATION

The present application claims priority under 35 U.S.C. § 119 to Japanese Patent Application No. 2018-020524, filed on Feb. 7, 2018, and Japanese Patent Application No. 2018-202108, filed on Oct. 26, 2018, the entire contents of which are incorporated herein by reference.

BACKGROUND OF THE INVENTION

1. Field of the Invention

The disclosures herein generally relate to an optical unit and an optical apparatus.

2. Description of the Related Art

Multicolor image forming apparatuses have been recently used for simplified printing as print-on-demand systems, along with an increase in speed. Thus, high-definition images have been demanded. For high-definition images, by using a two-dimensional light emitting element array, an interval between sub-scanning lines on a photoconductor can be set to 1/n of a recording density and pixels in an n×m dot matrix configuration can be used.

In recent years, by condensing light, application of the two-dimensional light emitting element array as a high-power laser has been considered. For example, the two-dimensional light emitting element array has been used as a light source for a laser ignition plug. When the two-dimensional light emitting element array is used as an optical component such as a high-power laser, it is desirable to efficiently condense light, emitting from the two-dimensional light emitting element array, into a small spot-like shape. For this purpose, it is effective to collimate light emitted from the two-dimensional light emitting element array before condensing light. In this configuration, in order to collimate light on a per-light-emitting-element basis, it is effective to dispose collimator lenses close to light emitting elements and to dispose a two-dimensional lens array above the two-dimensional light emitting element array. In order to adjust positions of the two-dimensional light emitting element array and the two-dimensional lens array with high accuracy, it is desirable to firmly fix the two-dimensional lens array directly above the two-dimensional light emitting element array with solder, for example.

However, coefficients of thermal expansion largely differ between the two-dimensional light emitting element array and the two-dimensional lens array because of differences in materials. Thus, due to an effect of residual stress caused by bonding of the light emitting element array and the lens array, a bonding portion may be cracked or peeled off at the time of bonding or over time. Patent Document 1 discloses a technique for reducing such residual stress.

According to the technique disclosed in Patent Document 1, the expected purpose can be accomplished. However, a method for fixing an optical module including a light emitting element array and a lens array to a heat dissipation member has not been investigated.

SUMMARY OF THE INVENTION

According to at least one embodiment, an optical unit includes an optical module that includes a light emitting element array in which a plurality of light emitting elements are arranged, a lens array disposed facing the light emitting element array on an optical path of light emitted from the plurality of light emitting elements, and a fixing part configured to fix the light emitting element array to the lens array. The optical unit also includes a member configured to have a larger coefficient of thermal expansion than a coefficient of thermal expansion of the light emitting element array and a fastening part configured to fasten the optical module on a surface of the member. The fastening part is configured to fasten the optical module so as to enable expanding and contracting in a plane parallel to the surface of the member.

RELATED-ART DOCUMENTS

Patent Documents

[Patent Document 1] Japanese Unexamined Patent Application Publication No. 2017-092287

BRIEF DESCRIPTION OF THE DRAWINGS

FIG. 1B is a cross-sectional view illustrating an example of a reference optical unit;

FIG. 7A is a plan view illustrating an optical unit according to a third embodiment;

FIG. 9B is a cross-sectional view illustrating the optical unit according to the fifth embodiment.

DESCRIPTION OF THE PREFERRED EMBODIMENTS

It is a general object of at least one embodiment of the present invention to provide an optical unit and an optical apparatus that can suppress stress exerted on a bonding portion due to thermal load caused by bonding of a lens array and light emitting element, even when an optical module is attached to a member such as a heat dissipation member having a large coefficient of thermal expansion.

In the following, embodiments of the present invention will be described with reference to the accompanying drawings. In the specification and drawings, elements having substantially the same functions or configurations are referred to by the same numerals and a duplicate description thereof will be omitted.

(Example of Reference Optical Unit)

Figure 1A:
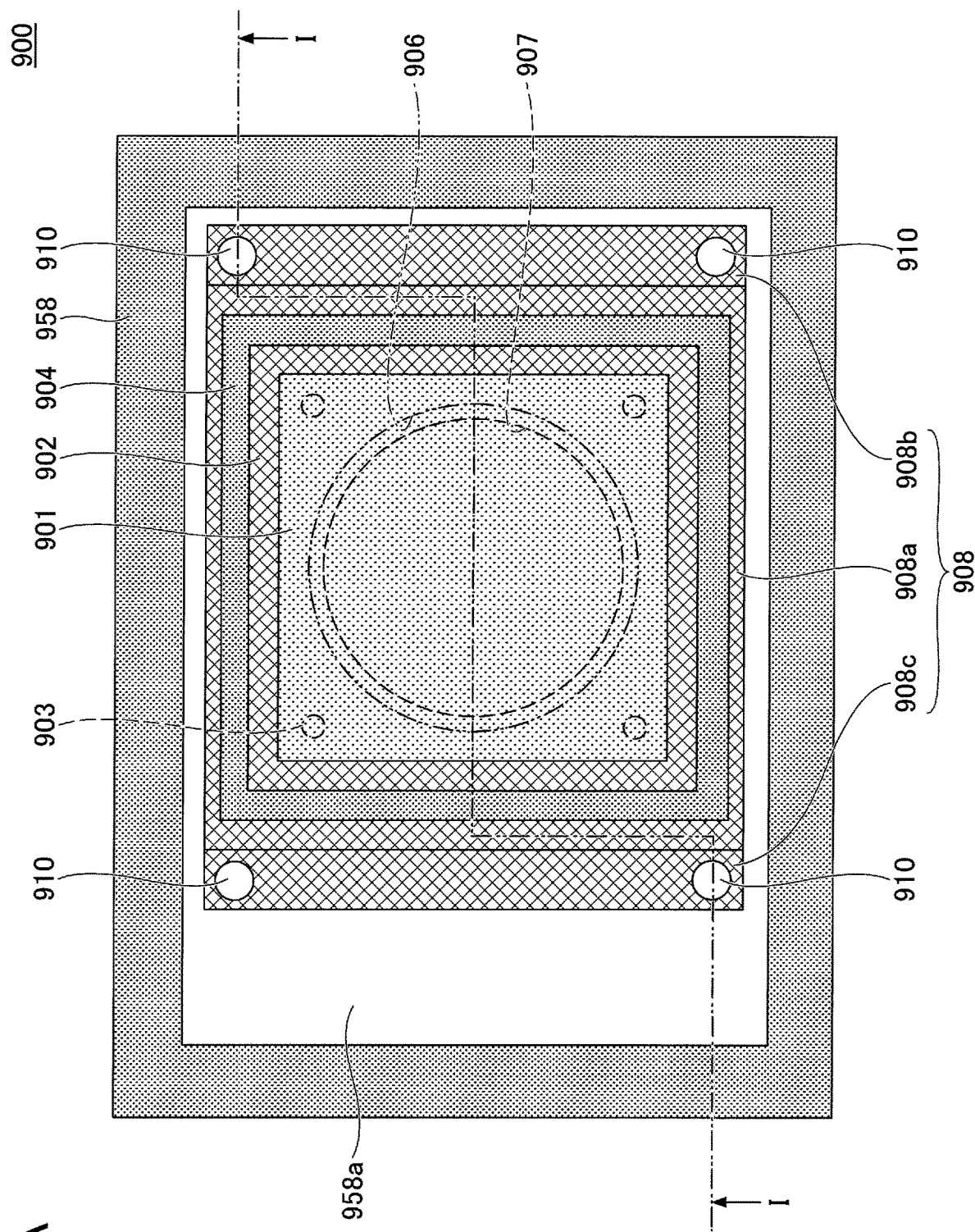
FIG. 1A is a plan view illustrating an example of a reference optical unit.

The inventor has investigated the cause of cracks or peeling of a bonding portion in an optical unit. An example of a reference optical unit used to investigate the cause will be described below. FIG. 1A is a plan view illustrating an example of a reference optical unit. FIG. 1B is a cross-sectional view illustrating an example of the reference optical unit. The cross-sectional view illustrated in FIG. 1B is taken through I-I of FIG. 1A.

As illustrated in FIG. 1A and FIG. 1B, an example of a reference optical unit 900 includes an optical module 961, a condenser lens 953, a heat dissipation member 958, and a cover 959. The optical module 961 includes a light emitting device 960, a sub-mount 904, and a package substrate 908. The light emitting device 960 includes a two-dimensional light emitting element array 902, a two-dimensional lens array 901, and fixing parts 903. The package substrate 908 includes a base 908a and flanges 908b and 908c that extend from the base 908a in directions opposite to each other. The heat dissipation member 958 has a recess 958a. Within the recess 958a, two positions of the flange 908b and two positions of the flange 908c of the optical module 961 are fixed to the heat dissipation member 958 with fixing screws 910. Namely, four corners of the package substrate 908 of the optical module 961 are fixed to the heat dissipation member 958 with the fixing screws 910. In FIG. 1A, the condenser lens 953 and the cover 959 are not illustrated.

Figure 2A:
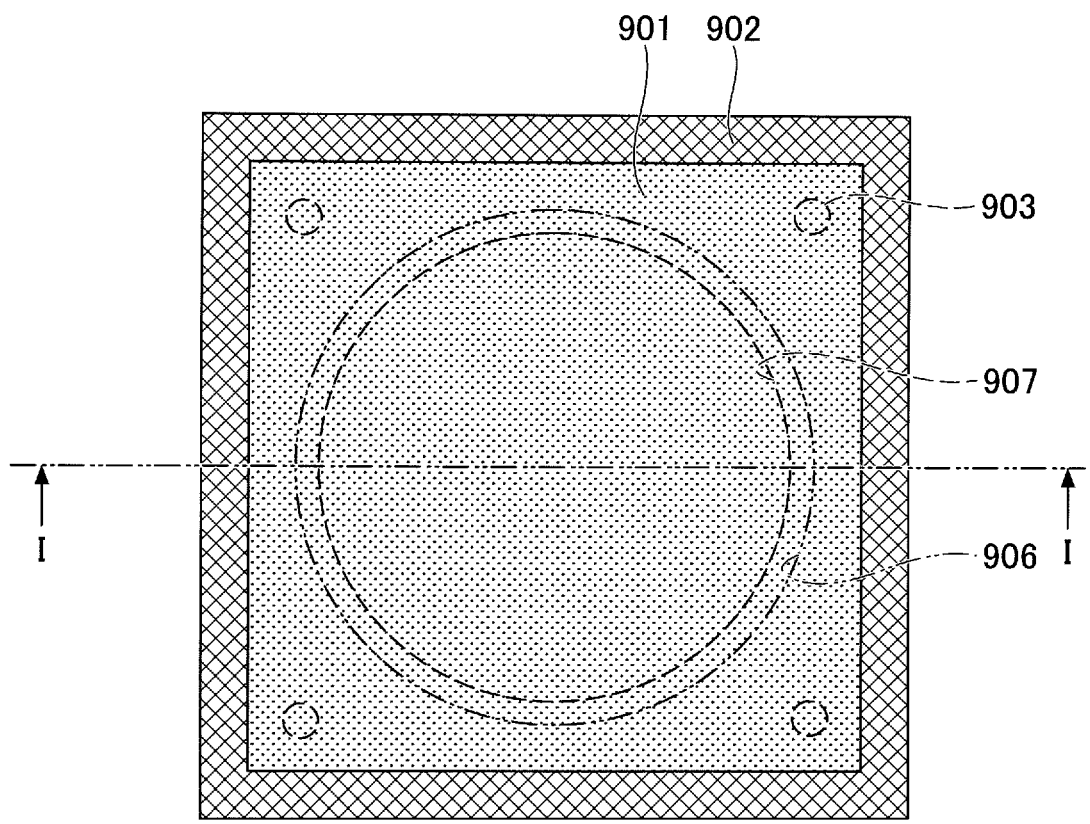
FIGS. 2A and 2B are plan views illustrating a light emitting device included in the example of a reference optical unit.
Figure 2B:
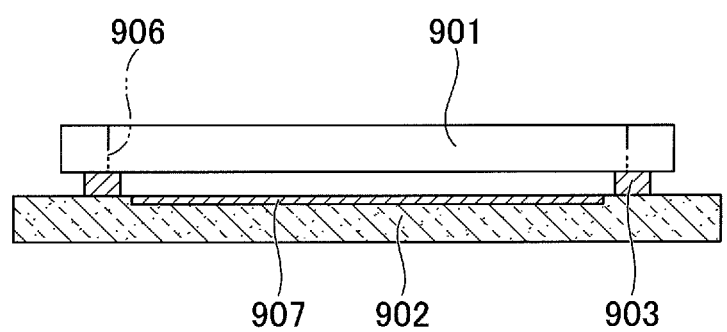

FIGS. 2A and 2B are plan views illustrating the light emitting device 960. In FIGS. 2A and 2B, electrical bonding is not illustrated. In the light emitting device 960, positions of the light emitting element array 902 and the lens array 901 are adjusted with high accuracy so as to collimate light on a per-light-emitting-element basis. An area 907 indicates a light emitting area of the light emitting element array 902, and an area 906 is a collimating area of the lens array 901. The light emitting element array 902 and the lens array 901 are fixed to each other with fixing parts 903 such as solder at four positions.

Figure 3:
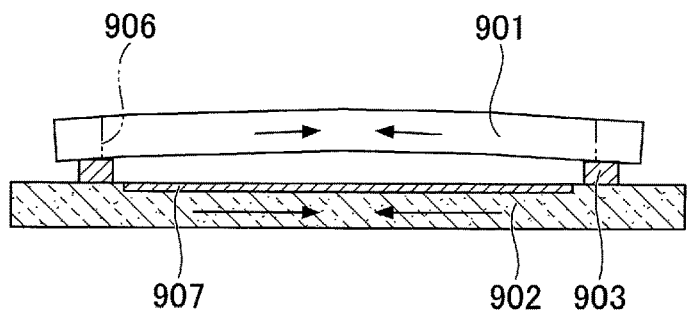
FIG. 3 is a diagram illustrating a state in which residual stress occurs in the light emitting device at the time of bonding.
Figure 4A:
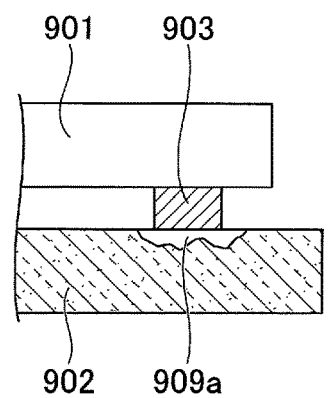
FIGS. 4A through 4C are diagrams illustrating effects of residual stress occurring in the light emitting device.
Figure 4B:
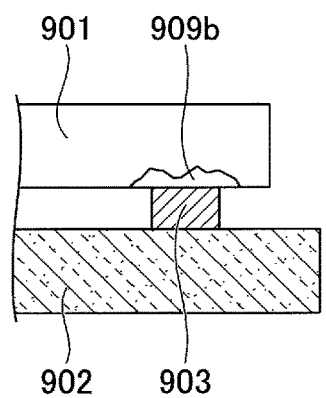
Figure 4C:
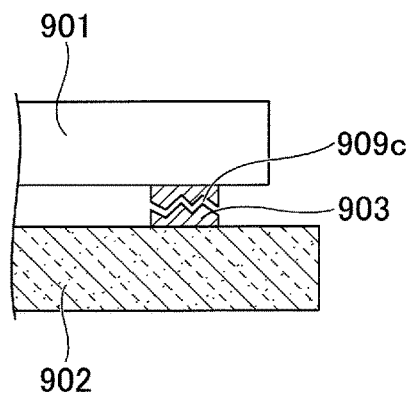

Conventionally, if the configuration disclosed in Patent Document 1 is not employed, there may be a case where a bonding portion may be cracked or peeled off due to a large difference in coefficients of thermal expansion between the light emitting element array 902 and the lens array 901. The reasons why a bonding portion may be cracked or peeled off will be described with reference to FIG. 3 and FIGS. 4A through 4C. FIG. 3 is a diagram illustrating a state in which residual stress occurs in the light emitting device 960 at the time of bonding. FIGS. 4A through 4C are diagrams illustrating effects of residual stress occurring in the light emitting device 960.

The light emitting element array 902 and the lens array 901 are fixed to each other with the fixing parts 903 such as solder. Thus, due to changes in temperature when the light emitting element array 902 and the lens array 901 are fixed with the fixing parts 903, for example, there may be a case where the lens array 901 may be deformed and stress may be exerted on the fixing parts 903, as illustrated in FIG. 3.

In general, a GaAs substrate is used to form the light emitting element array 902, and in general, a quartz substrate is used to form the lens array 901. Thus, the light emitting element array 902 contracts more than the lens array 901, as illustrated in FIG. 3. Lengths of arrows in FIG. 3 indicate degrees of contraction due to changes in temperature. As stress is always applied, a bonding portion may be cracked or damaged when a heating state is returned to a normal temperature state at the time of bonding, or over time.

To be more specific, in the light emitting device 960, a crack 909a may occur in the light emitting element array 902 as illustrated in FIG. 4A, for example. Also, as illustrated in FIG. 4B, for example, a crack 909b may occur in the lens array 901. Also, as illustrated in FIG. 4C, for example, a crack 909c may occur in a fixing part 903.

According to the configuration disclosed in Patent Document 1, it is possible to prevent these cracks. To be more specific, among three or more fixing parts 903, some of the fixing parts 903 are made of a different material from the rest of the fixing parts 903, allowing cracks to be prevented. Also, at least one of the fixing parts 903 is provided with a stress absorbing member, allowing cracks to be prevented.

Light emitting elements that configure the light emitting element array 902 are of high power and generate a large amount of heat. In order to release such heat to the outside, the optical module 961 is fixed to the heat dissipation member 958 in the optical unit 900. As illustrated in FIG. 1B, in the optical unit 900, the optical module 961 is configured by disposing the light emitting device 960 over the package substrate 908 having a coefficient of thermal expansion similar to that of the light emitting element array 902, with the sub-mount 904 being interposed therebetween. Also, the optical module 961 is fixed to the heat dissipation member 958, and the optical module 961 is covered by the cover 959 to which the condenser lens 953 is attached.

However, in this example of the reference optical unit 900, even if materials of the fixing parts 903 are appropriately selected and at least one of the fixing parts 903 is provided with a stress absorbing member, a bonding portion may be cracked or peeled off when, in a reliability test, thermal load such as thermal cycling is applied in a state in which the optical module 961 including the light emitting device 960 is fixed to the heat dissipation member 958. In order to determine this cause, the inventor has made earnest investigations. As a result, the inventor has found that thermal stress acting on the light emitting element array 902 is significantly larger when the optical module 961 is incorporated into the optical unit 900 than when the optical module 961 is not incorporated into the optical unit 900 and is separated alone. Namely, it has been found that, in a state in which the optical module 961 is incorporated into the optical unit 900, the light emitting element array 902 is largely affected by thermal stress of the heat dissipation member 958 and the cover 959. This is because a coefficient of thermal expansion of the entirety of the heat dissipation member 958 and the cover 959 is significantly larger than a coefficient of thermal expansion of the entire optical module 961, and also because the optical module 961 is fixed to the heat dissipation member 958. Thus, when design considerations are only for the fixing parts 903, such large thermal stress is not sufficiently released and the fixing parts 903 may be cracked or peeled off. Also, one of the reasons why large thermal stress is applied to the light emitting element array 902 is that the total volume of the heat dissipation member 958 and the cover 959 is larger than the volume of the optical module 961. Further, if a bonding portion is cracked or peeled off, the light emitting element array 902 and the lens array 901 are relatively displaced in an optical axis direction or in a direction orthogonal to the optical axis. This causes light such as laser beams emitted from the light emitting elements to fail to pass through proper positions of the lenses. As a result, optical characteristics of the optical unit 900 may deteriorate.

As a material of the heat dissipation member 958, high-purity copper is preferable in terms of heat dissipation efficiency. However, the coefficient of thermal expansion of copper is large. If high-purity copper is used for the heat dissipation member 958, coefficients of thermal expansion become largely different between the heat dissipation member 958 and the optical module 961. In order to reduce such a difference in coefficients of thermal expansion, if copper alloys, ceramics, or the like are used for the heat dissipation member 958, heat dissipation efficiency significantly decreases, and thus performance of the optical module 961 fails to be sufficiently exhibited. As described above, in the example of the reference optical unit 900, the performance of the optical module 961 and fracture resistance of the fixing parts 903 are in a trade-off relationship.

Further, for commonly used materials, the coefficient of thermal expansion of the lens array 901 is approximately $1 \times 10^{-6}/°$ C., the coefficient of thermal expansion of the light emitting element array 902 is approximately $6 \times 10^{-6}/°$ C., the coefficient of thermal expansion of the sub-mount 904 is approximately $7 \times 10^{-6}/°$ C., and the coefficient of thermal expansion of the package substrate 908 is approximately $7 \times 10^{-6}/°$ C. Also, for commonly used materials, the coefficient of thermal expansion of the heat dissipation member 958 is approximately $17 \times 10^{-6}/°$ C. and the coefficient of thermal expansion of the cover 959 is approximately $23 \times 10^{-6}/°$ C. Therefore, in the example of the reference optical unit 900, thermal strain becomes significantly large due to influences of the heat dissipation member 958 and the cover 959.

First Embodiment

Figure 5A:
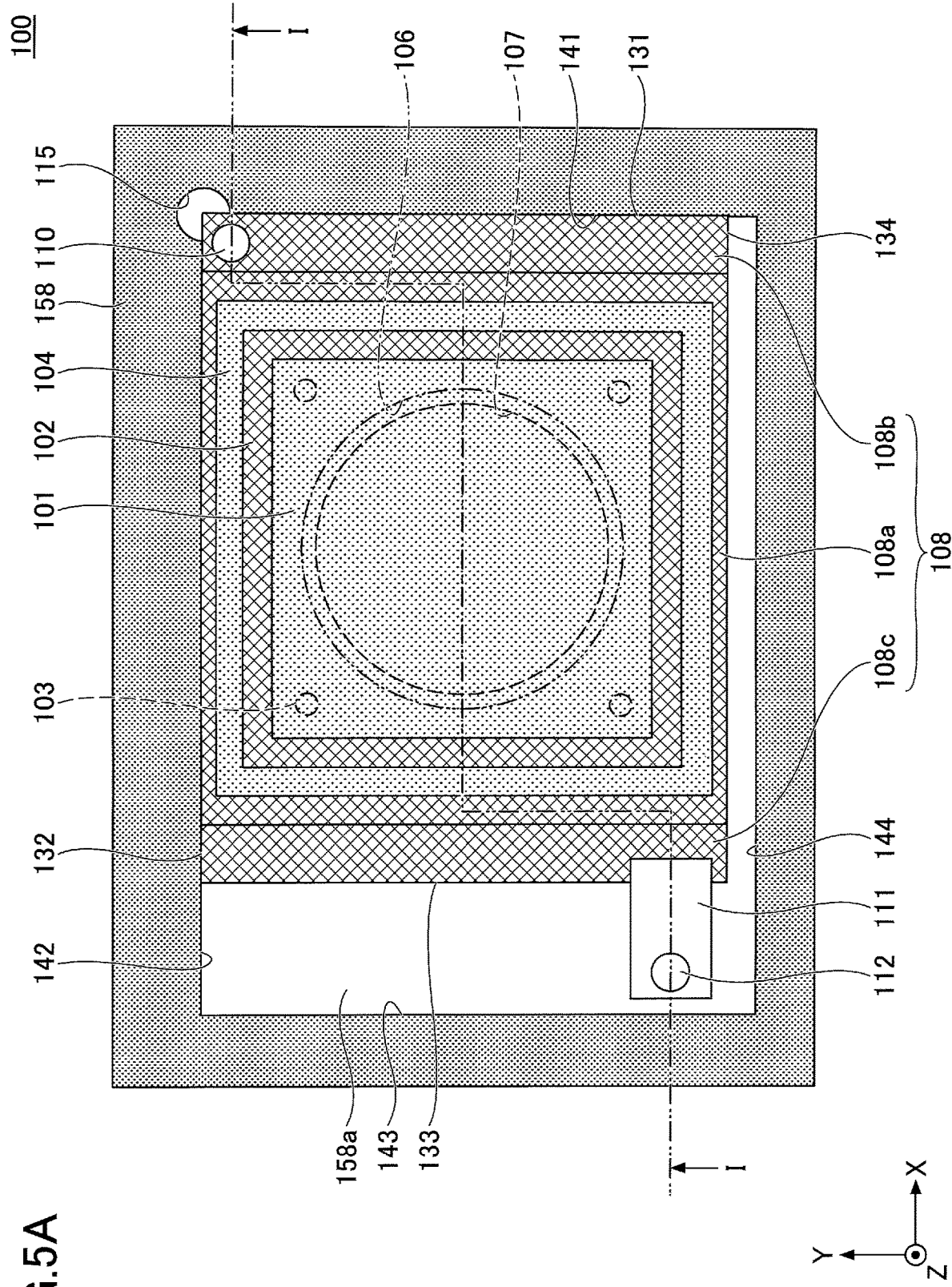
FIG. 5A is a plan view illustrating an optical unit according to a first embodiment.
Figure 5B:
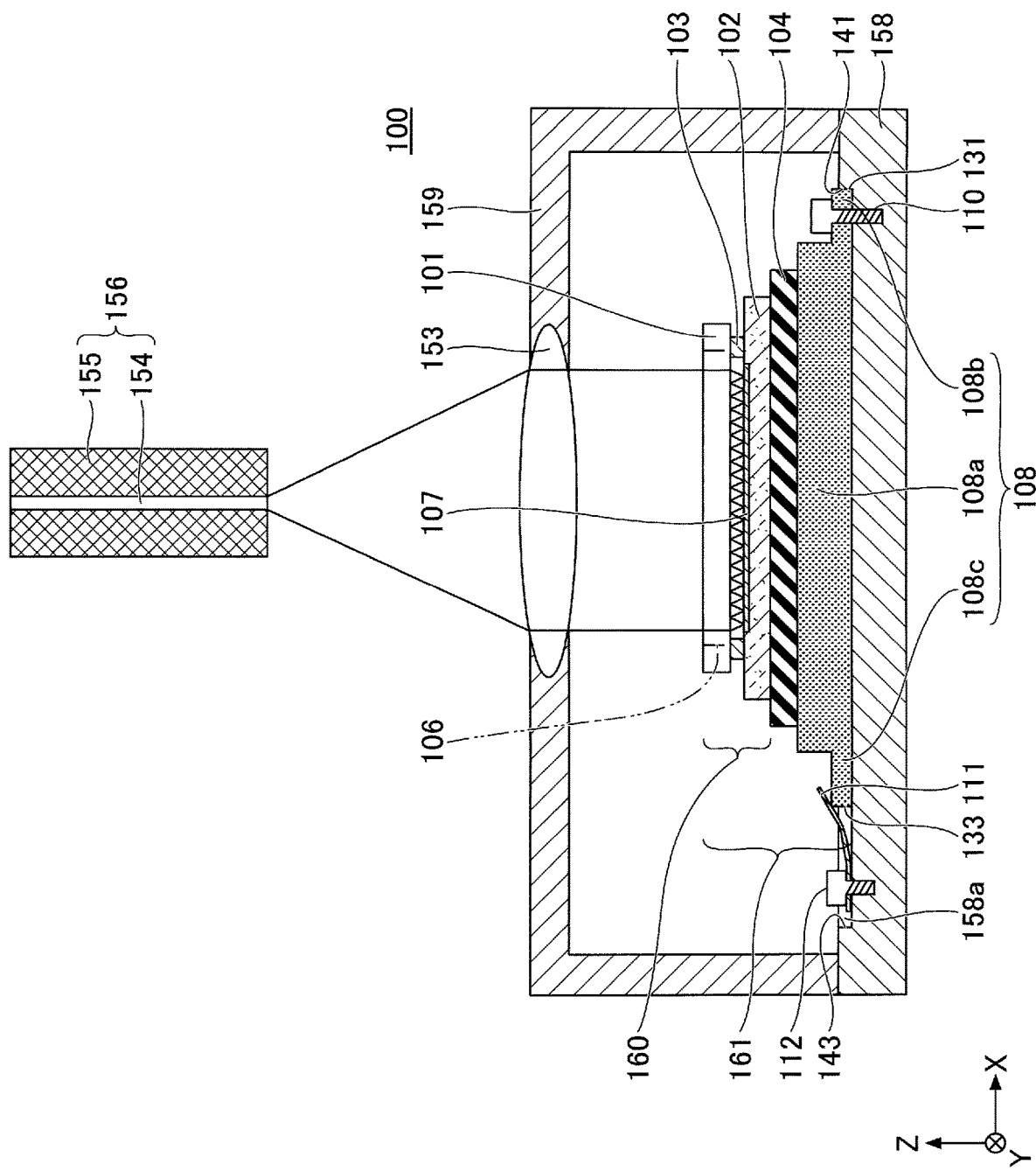
FIG. 5B is a cross-sectional view illustrating the optical unit according to the first embodiment.

Next, a first embodiment will be described. FIG. 5A is a plan view illustrating an optical unit according to the first embodiment. FIG. 5B is a cross-sectional view illustrating the optical unit according to the first embodiment. The cross-sectional view of FIG. 5B is taken through line I-I of FIG. 5A.

As illustrated in FIG. 5A and FIG. 5B, an optical unit 100 according to the first embodiment includes an optical module 161, a condenser lens 153, a heat dissipation member 158, and a cover 159. The optical module 161 is fixed to one surface of the heat dissipation member 158. The optical module 161 includes a light emitting device 160, a sub-mount 104, and a package substrate 108. The light emitting device 160 includes a two-dimensional light emitting element array 102, a two-dimensional lens array 101, and fixing parts 103. The package substrate 108 has a rectangular planar shape, and includes a base 108a and flanges 108b and 108c that extend from the base 108a in directions opposite to each other. In FIG. 5A, the condenser lens 153 and the cover 159 are not illustrated.

In the light emitting device 160, positions of the light emitting element array 102 and the lens array 101 are adjusted with high accuracy so as to collimate light on a per-light-emitting-element basis. The light emitting element array 102 and the lens array 101 are bonded to each other with fixing parts 103 such as solder at four positions. The light emitting element array 102 includes a two-dimensional light emitting area 107, and the lens array 101 includes a two-dimensional collimating area 106. The light emitting device 160 is bonded to the sub-mount 104 by using solder, for example, and the sub-mount 104 is bonded to the package substrate 108 by using solder, for example. For example, the solder used for the fixing parts 103 is Pb-free solder such as SnAgCu-based solder, the solder used to bond the light emitting element array 102 to the sub-mount 104 is AuSn solder, and the solder used to bond the sub-mount 104 to the package substrate 108 is Pb-free solder such as SnAgCu-based solder.

The heat dissipation member 158 has a recess 158a. The recess 158a has a rectangular shape in planar view and has side surfaces 141 through 144. An escape space 115 is formed at a corner where the side surface 141 and the side surface 142 meet. A bottom surface, a pair of the side surfaces 141 and 143, and a pair of the side surfaces 142 and 144 of the recess 158a are orthogonal to each other. The bottom surface is parallel to an XY plane, the side surfaces 141 and 143 are parallel to a YZ plane, and the side surfaces 142 and 144 are parallel to a ZX plane. Accordingly, three orthogonal axes are defined. A shape of the optical module 161 in planar view corresponds to a shape of the package substrate 108 in planar view. The package substrate 108 has sides 131 through 134 facing the respective side surfaces 141 through 144. The side 131 abuts the side surface 141 that is a first abutting reference surface, and the side 132 abuts the side surface 142 that is a second abutting reference surface. Also, a gap is formed between the side 133 and the side surface 143 and between the side 134 and the side surface 144. The abutting reference surfaces (the side surfaces 141 and 142) are examples of abutting portions.

In the vicinity of the corner where the side surface 141 and the side surface 142 meet, the package substrate 108 is fixed to the heat dissipation member 158 with a fixing screw 110. In the vicinity of a corner diagonally opposite to the corner where the side surface 141 and the side surface 142 meet, a leaf spring 111 is attached to the heat dissipation member 158 with a fixing screw 112. The fixing screw 110 is an example of a fastening part or a module fixing part. The leaf spring 111 and the fixing screw 112 are examples of fastening parts or counteracting parts. A pressing force of the leaf spring 111 is 60 N, for example. The leaf spring 111 presses a flange 108c against the bottom surface of the recess 158a, and also presses the package substrate 108 against the side surface 141. Therefore, the leaf spring 111 maintains a position in a Z-axis direction of the optical module 161, while exerting a counteracting force against expansion of the optical module 161 in the XY plane. The force exerted from the leaf spring 111 to the optical module 161 maintains the position in the Z-axis direction of the optical module 161 with respect to the dissipation member 158, but still allows the optical module 161 to expand and contract in the XY plane. For example, thermal conductive grease is applied between the package substrate 108 and the heat dissipation member 158, thus providing thermal conductivity and lubrication between the package substrate 108 and the heat dissipation member 158.

As illustrated in FIG. 5B, light emitted from the light emitting element array 102 is of laser beams having emission angles with respect to each of the light emitting elements. The laser beams are collimated when passing through the two-dimensional lens array 101 so as to become collimated light. The collimated light is condensed into a spot-like shape by the condenser lens 153 attached to the cover 159. The condensed light is incident on one side of an optical fiber 156 and is emitted from the other side of the optical fiber 156. For example, the optical fiber 156 has a double layer structure having a core 154 located at the center and cladding layers 155, where the core 154 is confined between the cladding layers 155. The light condensed by the condenser lens 153 is incident on the core 154 and propagates in the core 154.

The light emitting element array 102 generates heat when emitting light. Stress exerted on the fixing parts 103 due to a difference in coefficients of thermal expansion between the lens array 101 and the light emitting element array 102 can be reduced by employing the configuration disclosed in Patent Document 1 and providing at least one of the fixing parts 103 with a stress absorbing member. Also, even if a material such as high-purity copper having high heat dissipation efficiency and a large coefficient of thermal expansion is used for the heat dissipation member 158, the light emitting element array 102 is less affected by thermal strain of the heat dissipation member 158. This is because the optical module 161 and the heat dissipation member 158 are fixed to each other with the fixing screw 110 at only one position, and the leaf spring 111 does not prevent the optical module 161 from expanding and contracting relative to the heat dissipation member 158 while pressing the optical module 161 against the dissipation member 158. Accordingly, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158. Also, the optical module 161 thermally expands and thermally contracts, with the position of the fixing screw 110 acting as the origin. Accordingly, even if a thermal expansion and contraction cycle occurs, the position of the optical module 161 with respect to the heat dissipation member 158 is kept constant.

In the following, a method for attaching the optical module 161 to the heat dissipation member 158 will be described. In this method, first, thermal conductive grease is applied to the lower surface of the package substrate 108, and the package substrate 108 is placed in the recess 158a. Next, the package substrate 108 is moved in the XY plane, such that the side 131 abuts the side surface 141, which is the first abutting reference surface, and also the side 132 abuts the side surface 142, which is the second abutting reference surface. At this time, a corner, where the side 131 and the side 132 of the package substrate 108 meet, enters the escape space 115 and does not make contact with the side surface 141 nor the side surface 142. Subsequently, a flange 108b is fixed to the heat dissipation member 158 with the fixing screw 110 at only one position. Next, a part of the leaf spring 111 is placed on the flange 108c, so as to maintain a state in which the side 131 makes contact with the side surface 141, the side 132 makes contact with the side surface 142, and the lower surface of the optical module 161 makes contact with the bottom surface of the recess 158a. In this way, the package substrate 108 can be attached to the heat dissipation member 158 while adjusting the positions with high accuracy.

Second Embodiment

Figure 6A:
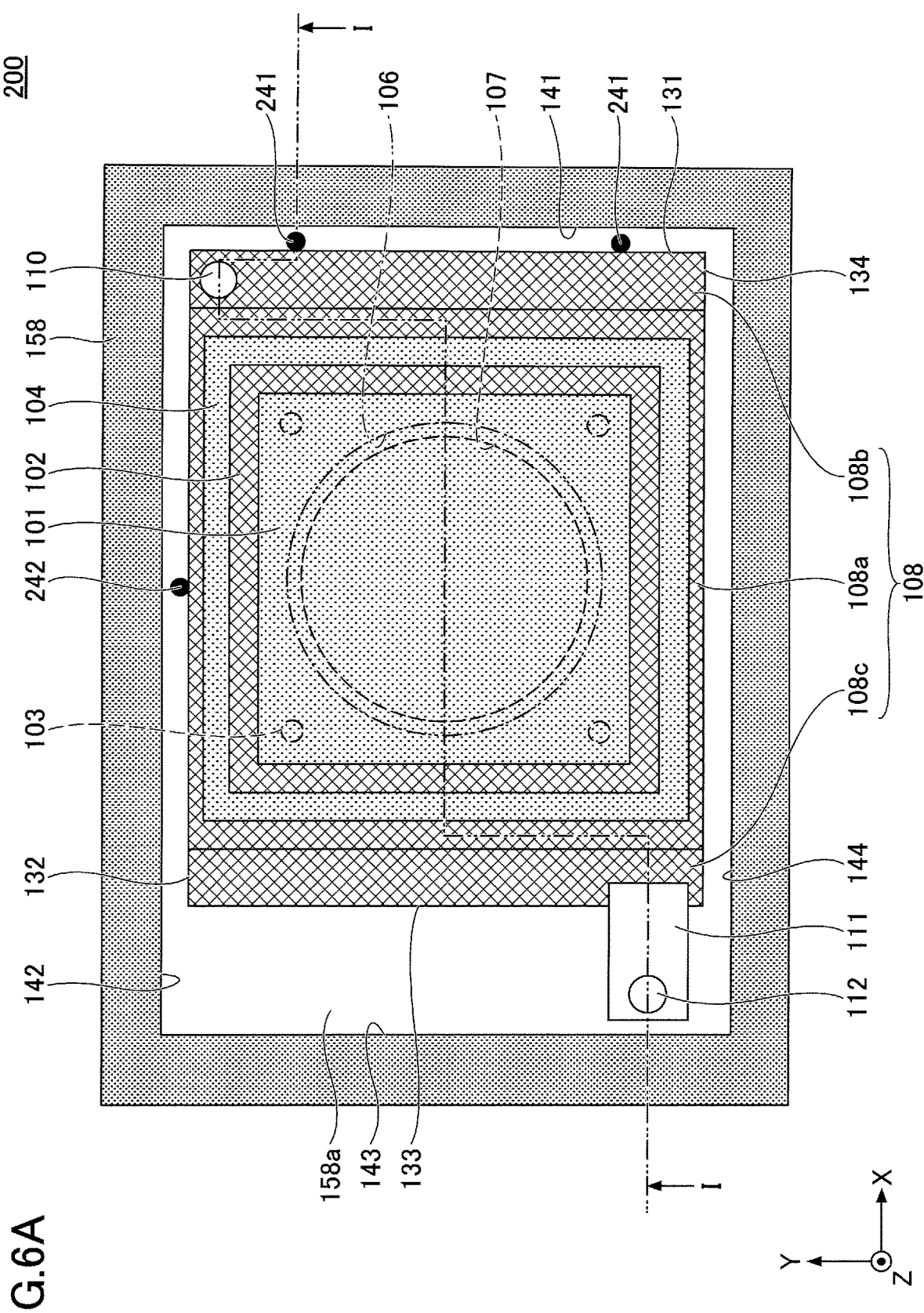
FIG. 6A is a plan view illustrating an optical unit according to a second embodiment.
Figure 6B:
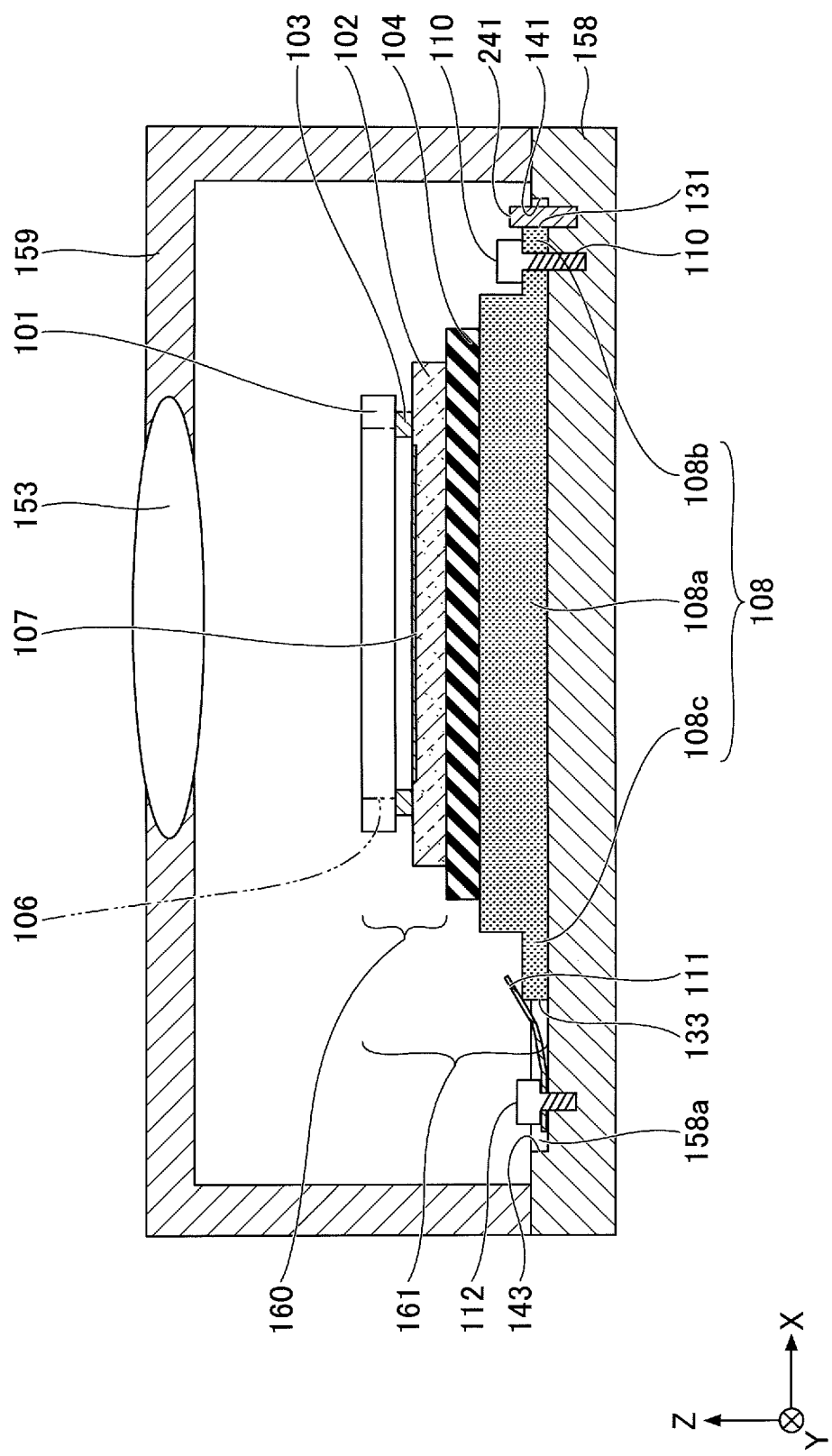
FIG. 6B is a cross-sectional view illustrating the optical unit according to the second embodiment.

Next, a second embodiment will be described. FIG. 6A is a plan view illustrating an optical unit according to the second embodiment. FIG. 6B is a cross-sectional view illustrating the optical unit according to the second embodiment. The cross-sectional view of FIG. 6B is taken through line I-I of FIG. 6A. In FIG. 6A, the condenser lens 153 and the cover 159 are not illustrated. Although the abutting reference surfaces are used as abutting portions in the first embodiment, abutting reference pins are used as abutting portions in the second embodiment.

In an optical unit 200 according to the second embodiment, within the recess 158a, two first abutting reference pins 241 are disposed near the side surface 141, and a second abutting reference pin 242 is disposed near the side surface 142. The two abutting reference pins 241 are arranged alongside each other in the Y-axis direction. The side 131 of the package substrate 108 abuts the two abutting reference pins 241, and the side 132 of the package substrate 108 abuts the abutting reference pin 242. The leaf spring 111 presses the flange 108c against the bottom surface of the recess 158a, and also presses the package substrate 108 against the two abutting reference pins 241. A force exerted from the leaf spring 111 to the optical module 161 maintains the position in the Z-axis direction of the optical module 161 with respect to the dissipation member 158, but still allows the optical module 161 to expand and contract in the XY plane. Note that the escape space 115 is not provided. The abutting reference pins 241 and 242 are examples of abutting portions. Other configurations are similar to those of the first embodiment.

In the second embodiment, similarly to the first embodiment, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158. Also, the optical module 161 thermally expands and thermally contracts, with the position of the fixing screw 110 acting as the origin. Accordingly, even if a thermal expansion and contraction cycle occurs, the position of the optical module 161 with respect to the heat dissipation member 158 is kept constant.

In the following, a method for attaching the optical module 161 to the heat dissipation member 158 will be described. In this method, first, thermal conductive grease is applied to the lower surface of the package substrate 108, and the package substrate 108 is placed in the recess 158a. Next, the package substrate 108 is moved in the XY plane, such that the side 131 abuts the two abutting reference pins 241, and also the side 132 abuts the abutting reference pin 242. At this time, because the abutting reference pins 241 are disposed away from the side surface 141 and the abutting reference pin 242 is disposed away from the side surface 142, a corner where the side 131 and the side 132 of the package substrate 108 meet does not make contact with the side surface 141 nor the side surface 142. Subsequently, the flange 108b is fixed to the heat dissipation member 158 with the fixing screw 110 at only one position. Next, a part of the leaf spring 111 is placed on the flange 108c, so as to maintain a state in which the side 131 makes contact with the two abutting reference pins 241, the side 132 makes contact with the abutting reference pin 242, and the lower surface of the optical module 161 makes contact with the bottom surface of the recess 158a. In this way, the package substrate 108 can be attached to the heat dissipation member 158 while adjusting the positions with high accuracy.

Only the reference pins 241 may be disposed or only the abutting reference pin 242 may be disposed. In this case, similarly to the first embodiment, the optical module 161 is positioned by causing the side 131 to abut the side surface 141, which is the abutting reference surface, or causing the side 132 to abut the side surface 142, which is the abutting reference surface. In this case, similarly to the first embodiment, the escape space 115 may be provided.

Third Embodiment

Figure 7B:
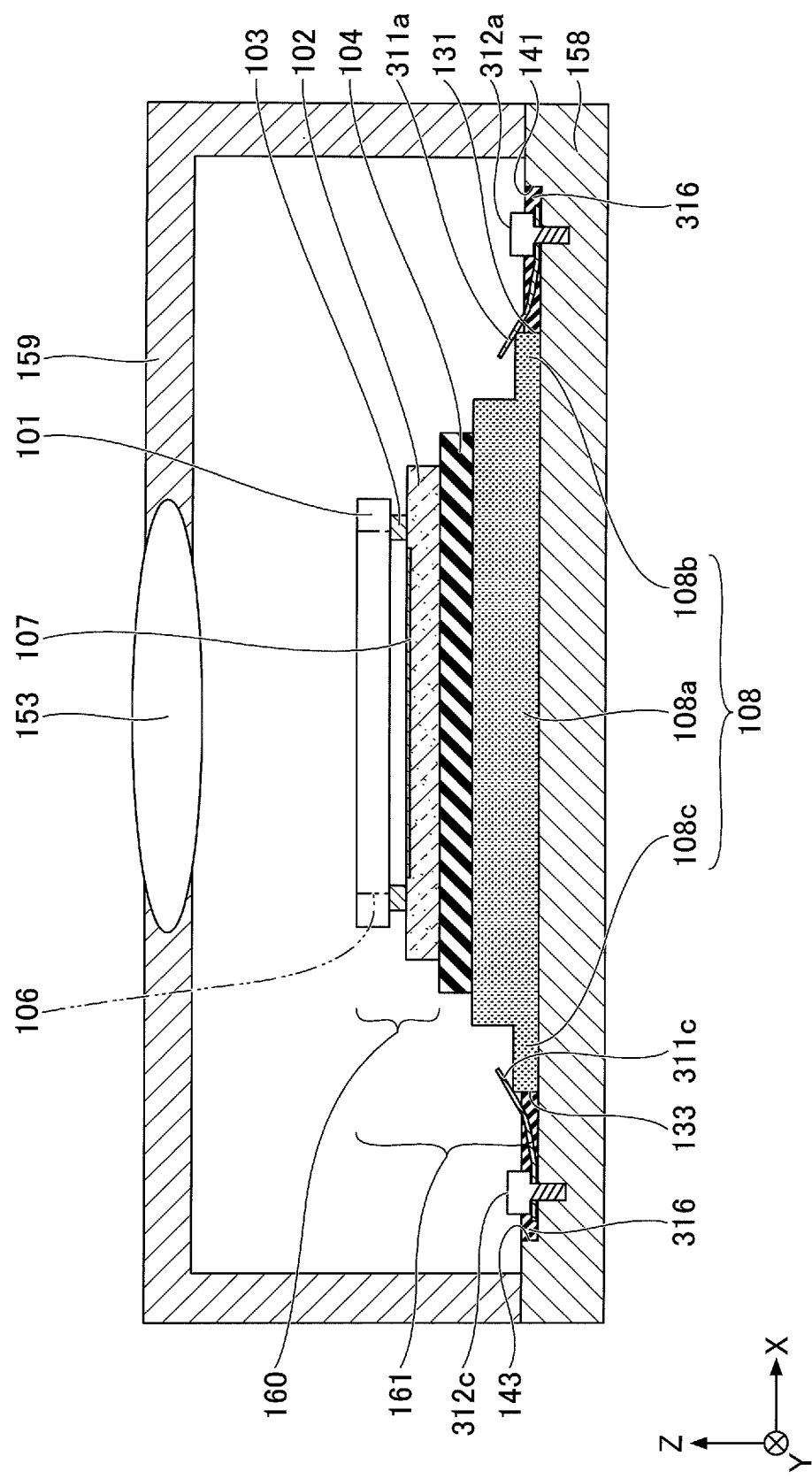
FIG. 7B is a cross-sectional view illustrating the optical unit according to the third embodiment.

Next, a third embodiment will be described. FIG. 7A is a plan view illustrating an optical unit according to the third embodiment. FIG. 7B is a cross-sectional view illustrating the optical unit according to the third embodiment. The cross-sectional view of FIG. 7B is taken through line I-I of FIG. 7A. In FIG. 7A, the condenser lens 153 and the cover 159 are not illustrated.

In an optical unit 300 according to the third embodiment, leaf springs 311a through 311d and fixing screws 312a through 312d are disposed, instead of the fixing screw 110, the leaf spring 111, and the fixing screw 112 of the first embodiment. More specifically, within the recess 158a, in the vicinity of the corner where the side surface 141 and the side surface 142 meet, the leaf spring 311a is attached to the heat dissipation member 158 with the fixing screw 312a. Also, in the vicinity of the corner where the side surface 142 and the side surface 143 meet, the leaf spring 311b is attached to the heat dissipation member 158 with the fixing screw 312b. Also, in the vicinity of the corner where the side surface 143 and the side surface 144 meet, the leaf spring 311c is attached to the heat dissipation member 158 with the fixing screw 312c. Also, in the vicinity of the corner where the side surface 144 and the side surface 141 meet, the leaf spring 311d is attached to the heat dissipation member 158 with the fixing screw 312d. A part of the leaf spring 311a and a part of the leaf spring 311d are placed on the flange 108b, and a part of the leaf spring 311b and a part of the leaf spring 311c are placed on the flange 108c. The leaf springs 311a and 311d press the flange 108b against the bottom surface of the recess 158a, and also press the package substrate 108 against the leaf springs 311b and 311c. The leaf springs 311b and 311c press the flange 108c against the bottom surface of the recess 158a, and also press the package substrate 108 against the leaf springs 311a and 311d. Further, an elastic member 316 such as silicone rubber is provided between the sides 131 through 134 and the side surfaces 141 through 144. The leaf springs 311a through 311d maintain the position in the Z-axis direction of the optical module 161, while exerting a counteracting force against expansion of the optical module 161 in the XY plane. The leaf springs 311a through 311d are examples of fastening parts or counteracting parts. Also, the elastic member 316 exerts a counteracting force against expansion of the optical module 161 in the XY plane. The force exerted from the leaf springs 311a through 311d to the optical module 161 maintains the position in the Z-axis direction of the optical module 161 with respect to the dissipation member 158, but still allows the optical module 161 to expand and contract in the XY plane. Note that the escape space 115 is not provided. Other configurations are similar to those of the first embodiment.

In the third embodiment, the optical module 161 and the heat dissipation member 158 are not fixed to each other. Thus, the leaf springs 311a through 311d do not prevent expansion and contraction of the heat dissipation member 158 relative to the optical module 161. Accordingly, similarly to the first embodiment, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158. Also, it is preferable to provide the elastic member 316, in addition to the leaf springs 311a through 311d. By an effect of the elastic member 316, the optical module 161 elastically deforms in the positive X-direction and the negative X-direction. Accordingly, even if a thermal expansion and contraction cycle occurs, the position of the optical module 161 with respect to the heat dissipation member 158 is kept constant.

In the following, a method for attaching the optical module 161 to the heat dissipation member 158 will be described. In this method, first, thermal conductive grease is applied to the lower surface of the package substrate 108, and the package substrate 108 is placed in the recess 158a. Next, the package substrate 108 is moved to a predetermined position in the XY plane. Subsequently, a part of the leaf spring 311a and a part of the leaf spring 311d are placed on the flange 108b and a part of the leaf spring 311c and a part of the leaf spring 311b are placed on the flange 108c, such that the leaf springs 311a and 311d and leaf springs 311b and 311c together press against the optical module 161, thereby maintaining a state in which the lower surface of the optical module 161 makes contact with the bottom surface of the recess 158a. In this way, the package substrate 108 can be attached to the heat dissipation member 158 while adjusting the positions with high accuracy.

Fourth Embodiment

Figure 8A:
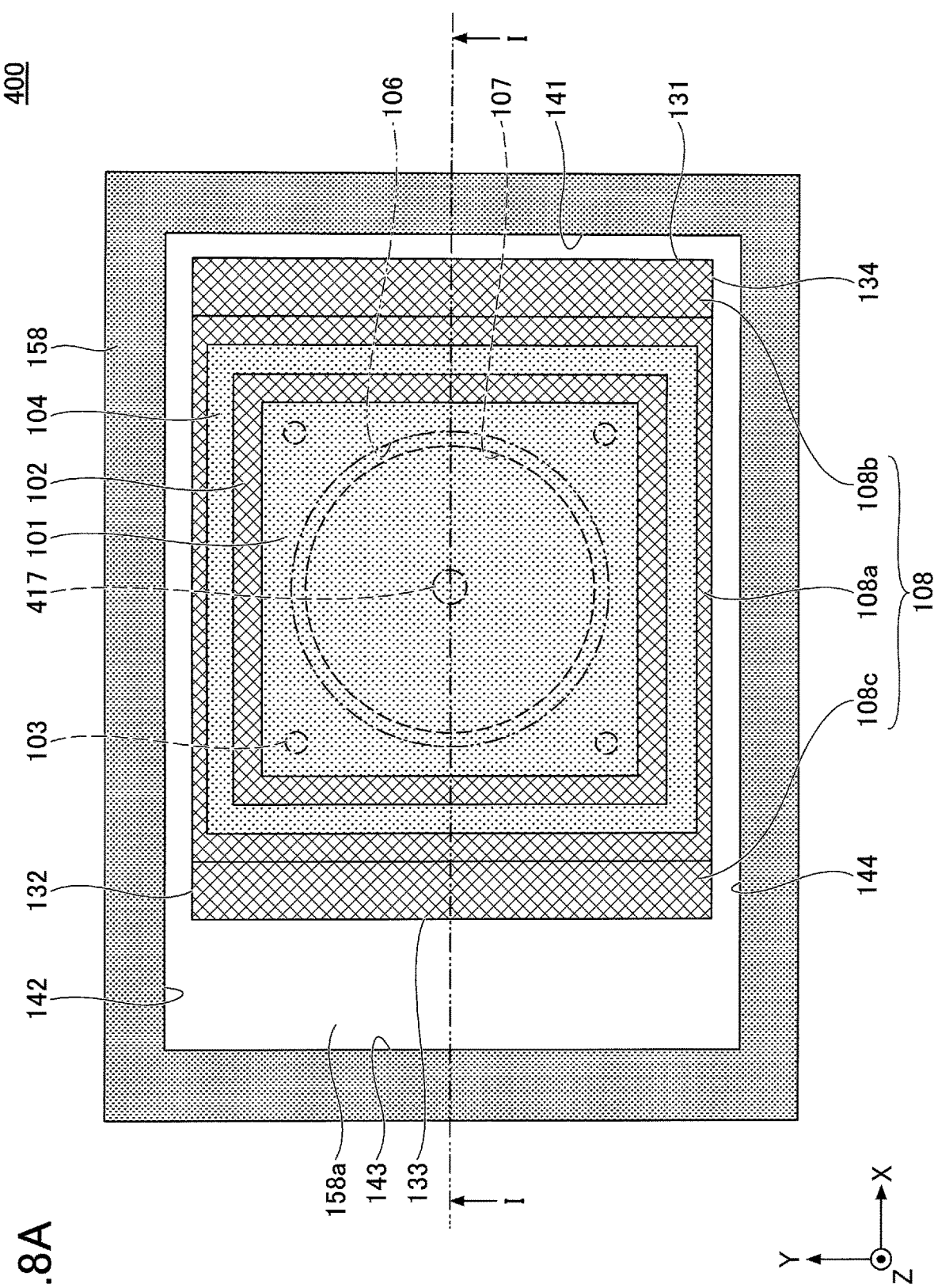
FIG. 8A is a plan view illustrating an optical unit according to a fourth embodiment.
Figure 8B:
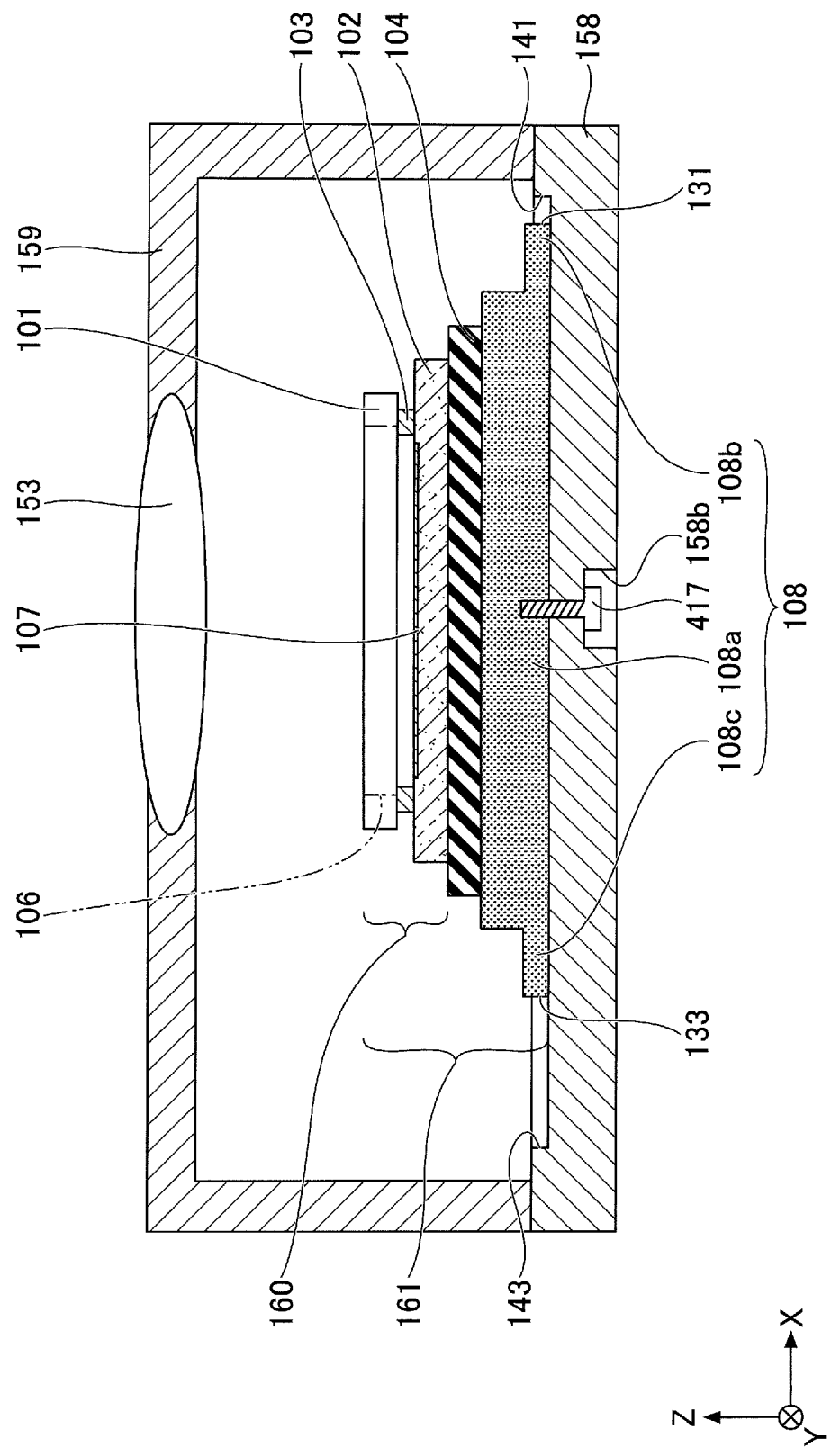
FIG. 8B is a cross-sectional view illustrating the optical unit according to the fourth embodiment.

Next, a fourth embodiment will be described. FIG. 8A is a plan view illustrating an optical unit according to the fourth embodiment. FIG. 8B is a cross-sectional view illustrating the optical unit according to the fourth embodiment. The cross-sectional view of FIG. 8B is taken through line I-I of FIG. 8A. In FIG. 8A, the condenser lens 153 and the cover 159 are not illustrated.

In an optical unit 400 according to the fourth embodiment, a center fixing screw 417 is disposed, instead of the fixing screw 110, the leaf spring 111, and the fixing screw 112 of the first embodiment. More specifically, a hole 158b is formed on the lower surface of the heat dissipation member 158, and the center fixing screw 417 is disposed in the hole 158b and protrudes from the recess 158a. Also, the package substrate 108 is fixed to the heat dissipation member 158 with the center fixing screw 417. The center fixing screw 417 is an example of a fastening part or a module fixing part. Also, there is a gap between the sides 131 through 134 and the side surfaces 141 through 144. Note that the escape space 115 is not provided. Other configurations are similar to those of the first embodiment.

In the fourth embodiment, the optical module 161 and the heat dissipation member 158 are fixed to each other with the center fixing screw 417 at only one position. Thus, expansion and contraction of the heat dissipation member 158 relative to the optical module 161 is not hindered. Accordingly, similarly to the first embodiment, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158.

Also in the fourth embodiment, even if a material such as high-purity copper having high heat dissipation efficiency and a large coefficient of thermal expansion is used for the heat dissipation member 158, the light emitting element array 102 is less affected by thermal strain of the heat dissipation member 158. This is because the optical module 161 and the heat dissipation member 158 are fixed to each other with the center fixing screw 417 at only one position. Accordingly, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158. Also, the optical module 161 thermally expands and thermally contracts, with the position of the screw 417 acting as the origin. Accordingly, even if a thermal expansion and contraction cycle occurs, the position of the optical module 161 with respect to the heat dissipation member 158 is kept constant.

In the following, a method for attaching the optical module 161 to the heat dissipation member 158 will be described. In this method, first, thermal conductive grease is applied to the lower surface of the package substrate 108, and the package substrate 108 is placed in the recess 158a. Next, the package substrate 108 is moved to a predetermined position in the X-axis direction and in the Y-axis direction. Subsequently, the package substrate 108 is fixed to the heat dissipation member 158 with the center fixing screw 417 at only one position. In this way, the package substrate 108 can be attached to the heat dissipation member 158 while adjusting the positions with high accuracy.

Thermal conductivity of the center fixing screw 417 is preferably greater than or equal to thermal conductivity of the heat dissipation member 158. A material of the center fixing screw 417 may be the same as the material of the heat dissipation member 158. The material of the center fixing screw 417 is not particularly limited, and is preferably a material having favorable thermal conductivity such as Ag or Cu. Metal such as CuW and CuMo may be used, and ceramics having excellent thermal conductivity such as AlN and SiC may be used.

Fifth Embodiment

Figure 9A:
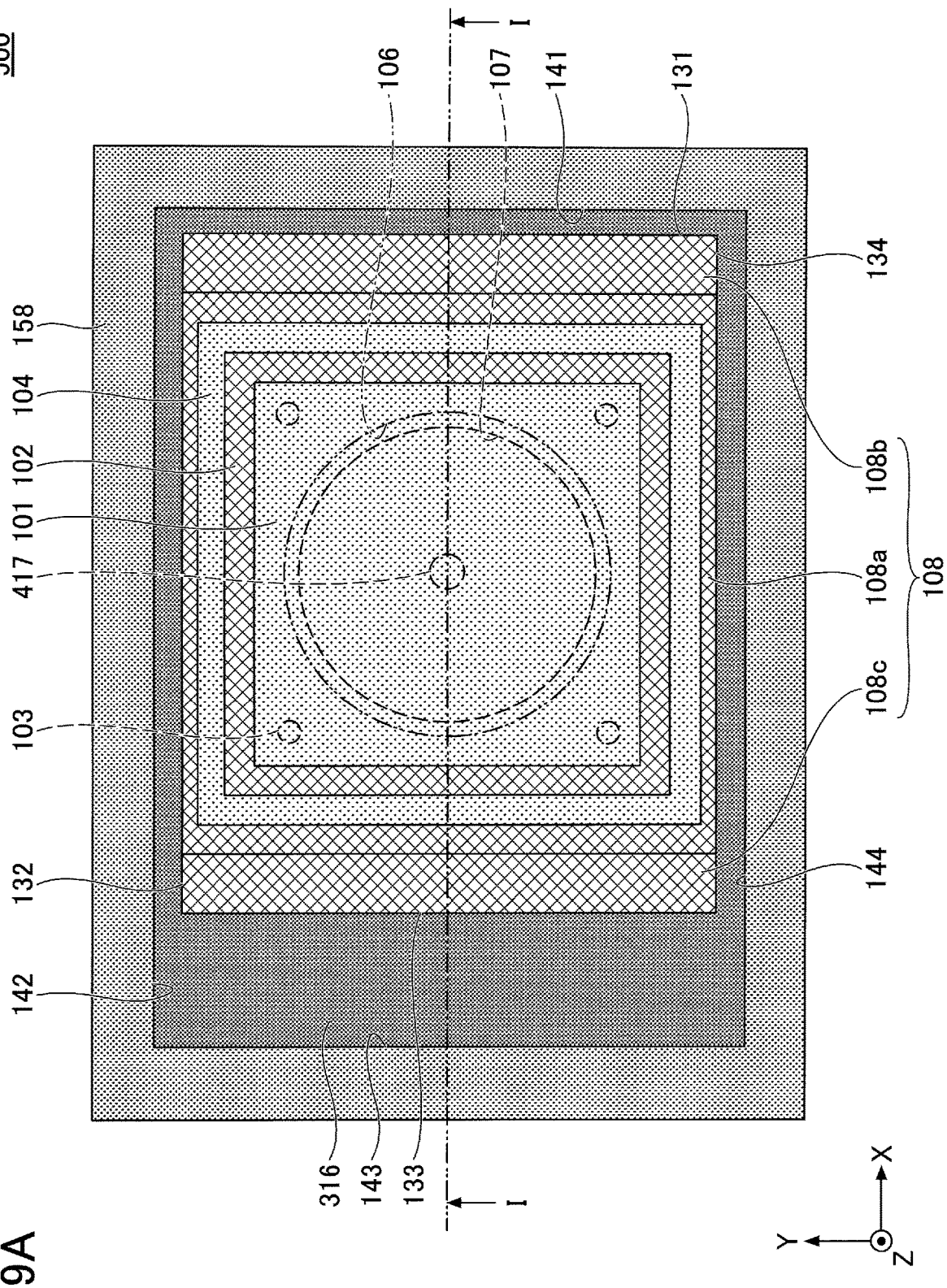
FIG. 9A is a plan view illustrating an optical unit according to a fifth embodiment.

Next, a fifth embodiment will be described. FIG. 9A is a plan view illustrating an optical unit according to the fifth embodiment. FIG. 9B is a cross-sectional view illustrating the optical unit according to the fifth embodiment. The cross-sectional view of FIG. 9B is taken through line I-I of FIG. 9A. In FIG. 9A, the condenser lens 153 and the cover 159 are not illustrated.

In an optical unit 500 according to the fifth embodiment, an elastic member 316 is disposed between the package substrate 108 and the side of the recess 158a of the optical unit 400 according to the fourth embodiment. Other configurations are similar to those in the fourth embodiment.

In the fifth embodiment, similarly to the fourth embodiment, even if the heat dissipation member 158 expands or contracts more than the optical module 161 due to changes in temperature of the light emitting element array 102, the optical module 161 is less affected by the expansion or contraction of the heat dissipation member 158. Thus, it becomes possible to prevent a bonding portion from being cracked or peeled off due to the expansion or contraction of the heat dissipation member 158. Also, the optical module 161 thermally expands and thermally contracts, with the position of the center fixing screw 417 acting as the origin. Further, by an effect of the elastic member 316, the optical module 161 elastically deforms in the positive X-direction and the negative X-direction. Accordingly, even if a thermal expansion and contraction cycle occurs, the position of the optical module 161 with respect to the heat dissipation member 158 is kept constant.

Instead of the leaf spring 111 or the leaf spring 311a through 311d, a coil spring such as a spring plunger may be used. A pressing force of a leaf spring is not particularly limited, and is preferably 20 N through 200N. If the pressing force is less than 20 N, there may be a possibility that an effect of the leaf spring would not be sufficiently exhibited. If the pressing force exceeds 200 N, there may be a possibility that the optical module 161 would be excessively fastened to the heat dissipation member 158.

Materials of the solder are not limited to the above-described materials, and SnCu-based solder, SnCuNiP-based solder, or pure Sn solder may be used. Instead of the solder, sintered metal or a resin bonding material having excellent thermal conductivity may be used for bonding. Examples of the sintered metal included sintered Au, sintered Ag, sintered Cu, sintered Ni, and a sintered Cu alloy. Examples of the resin bonding material having excellent thermal conductivity include a resin bonding material containing Au-, Ag-, Cu-, Ni-, or Al-based particles or containing a Au-, Ag-, Cu-, Ni-, or Al-based filler.

Among the four fixing parts 103, some of the fixing parts 103 are preferably made of a different material from the rest of the fixing parts 103, or at least one of the fixing parts 103 is provided with a stress absorbing member.

An elastic member having excellent thermal conductivity may be used, instead of thermal conductive grease applied between the optical module 161 and the heat dissipation member 158. The shape of the optical module in planar view is not limited to a rectangular shape, and may be a circular shape. Regardless of the shape of the optical module in planar view, two counteracting parts such leaf springs are preferably disposed at positions with the centroid of the optical module being interposed therebetween.

Sixth Embodiment

Figure 10:
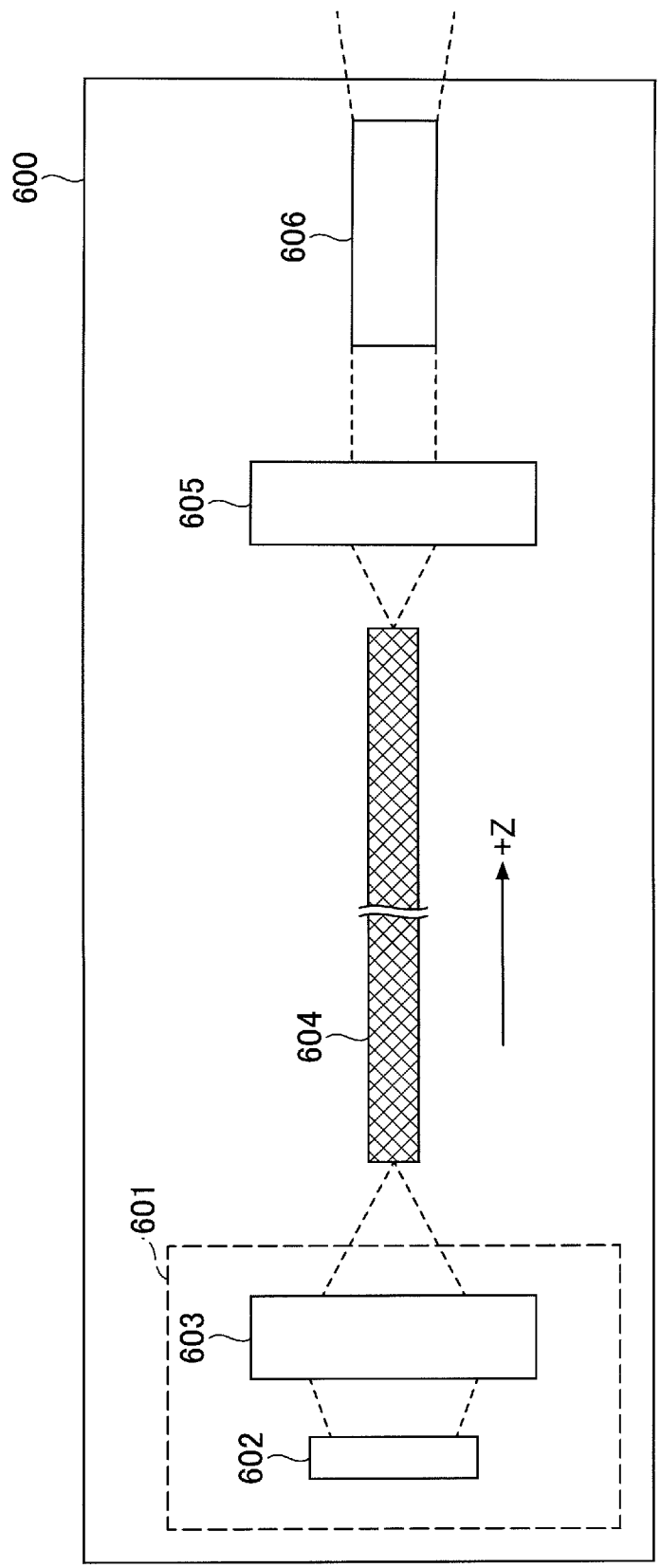
FIG. 10 is a diagram illustrating a laser apparatus according to a sixth embodiment.

Next, a sixth embodiment will be described. The sixth embodiment relates to a laser apparatus that includes an optical unit. The laser apparatus is an example of an optical apparatus. FIG. 10 is a diagram illustrating the laser apparatus according to the sixth embodiment.

As illustrated in FIG. 10, a laser apparatus 600 according to the sixth embodiment includes a surface-emitting laser array 602, a first condensing optical system 603, an optical fiber 604, a second condensing optical system 605, and a laser resonator 606. The surface-emitting laser array 602 and the first condensing optical system 603 are included in an optical unit 601. As the optical unit 601, the optical unit 100, 200, 300, 400, or 500 is used, for example. Namely, the surface-emitting laser array 602 can include the light emitting element array 102, and the first condensing optical system 603 can include the lens array 101 and the condenser lens 153. In the following description, a direction in which light is emitted from the surface-emitting laser array 602 is regarded as a positive Z-direction.

The surface-emitting laser array 602 is a light source for excitation and includes a plurality of light emitting parts. The light emitting parts are vertical-cavity surface emitting lasers (VCSELs). For example, a wavelength of light emitted from the surface-emitting laser array 602 is 808 nm.

In the surface-emitting laser array 602, a shift in a wavelength of emitted light resulting from temperature is very small. Thus, the surface-emitting laser array 602 is an advantageous light source for excitation by a Q-switched laser in which characteristics largely change due to a shift in an excitation wavelength. Accordingly, when the surface-emitting laser array 602 is used as a light source for excitation, there is an advantage that environmental temperature control becomes easy.

The first condensing optical system 603 condenses light emitted from the surface-emitting laser array 602.

The optical fiber 604 is disposed such that the center of a core on the negative z-side is located at a position where light is condensed by the first condensing optical system 603. As the optical fiber 604, an optical fiber having a core diameter of 1.5 mm and a numerical aperture (NA) of 0.39 is used, for example.

By disposing the optical fiber 604, the surface-emitting laser array 602 can be placed away from the laser resonator 606. Accordingly, flexibility in layout design can be increased.

Light incident on the optical fiber 604 propagates in the core 154 and is emitted from the positive Z-side of the core.

The second condensing optical system 605 is disposed on an optical path of light emitted from the optical fiber 604, and condenses the light. The light condensed by the second condensing optical system 605 enters the laser resonator 606.

The laser resonator 606 is a Q-switched laser having a laser medium and a saturable absorber, for example. In the laser resonator 606, light resonates and is amplified. The laser resonator 606 is an example of an optical element.

The optical apparatus is not limited to the laser apparatus. For example, the optical apparatus may have a light receiving element as an optical element. For example, a measurement object may be irradiated with light, that has been emitted from light emitting elements included in the optical unit 100, 200, 300, 400, or 500, and light reflected from or transmitted through the measurement object may enter the light receiving element. Namely, the optical apparatus may include a configuration in which light, which has been emitted from the light emitting elements included in the optical unit 100, 200, 300, 400, or 500, enters the light receiving element through the measurement object.

According to at least one embodiment, it is possible to suppress stress exerted on a bonding portion due to thermal load caused by bonding of a lens array and light emitting element, even when an optical module is attached to a member such as a heat dissipation member having a large coefficient of thermal expansion.

Further, the present invention is not limited to these embodiments, but various variations and modifications may be made without departing from the scope of the present invention.

What is claimed is:

1. An optical unit comprising:
an optical module that includes a light emitting element array in which a plurality of light emitting elements are arranged, a lens array disposed facing the light emitting element array on an optical path of light emitted from the plurality of light emitting elements, and a fixing part configured to fix the light emitting element array to the lens array,
a member configured to have a larger coefficient of thermal expansion than a coefficient of thermal expansion of the light emitting element array; and
a fastening part configured to fasten the optical module on a surface of the member, the surface including an area at which the optical module and the member contact;
wherein the fastening part is arranged on the surface;
wherein the fastening part is configured to fasten the optical module so as to enable expanding and contracting in a plane parallel to the surface of the member; and
wherein the fastening part maintains the position of the optical module in a direction orthogonal to the plane.

2. The optical unit according to claim 1, wherein the member has a first abutting portion on which a first side of the optical module abuts.

3. The optical unit according to claim 2, wherein the member has a second abutting portion on which a second side of the optical module meeting the first side of the optical module abuts.

4. The optical unit according to claim 1, wherein the fastening part includes a module fixing part configured to fix the optical module to the member at one position.

5. The optical unit according to claim 4, wherein the module fixing part is configured to fix a center of the optical module to the member.

6. The optical unit according to claim 3, wherein the fastening part includes a module fixing part configured to fix the optical module to the member at one position, and the module fixing part is configured to fix, to the member, a corner of the optical module where the first side and the second side of the optical module meet.

7. The optical unit according to claim 1, wherein the fastening part includes a counteracting part configured to exert a counteracting force against expansion of the optical module along the plane.

8. The optical unit according to claim 7, wherein the counteracting part is configured to press the optical module against the member so as to maintain the position of the optical module in the direction orthogonal to the plane.

9. The optical unit according to claim 7, wherein the counteracting part includes at least two counteracting parts disposed at positions with a centroid of the optical module being interposed therebetween.

10. An optical apparatus comprising:
the optical unit according to claim 1; and
an optical element on which light emitted from the plurality of light emitting elements is incident.

11. The optical unit according to claim 1, wherein the fastening part includes a screw.

12. The optical unit according to claim 1, wherein the fastening part includes a leaf spring.

13. The optical unit according to claim 1,
wherein the fastening part includes an elastic member provided between a side surface of the member and a side surface of the module.

14. An optical unit comprising:
an optical module that includes a light emitting element array in which a plurality of light emitting elements are arranged, a lens array disposed facing the light emitting element array on an optical path of light emitted from the plurality of light emitting elements, and a fixing part configured to fix the light emitting element array to the lens array;
a member and a cover configured to have a larger coefficient of thermal expansion than a coefficient of thermal expansion of the light emitting element array; and
a fastening part configured to fasten the optical module on a surface of the member;
wherein the cover is provided on the member and covers the optical module and the fastening part; and
wherein the fastening part is configured to fasten the optical module so as to enable expanding and contracting in a plane parallel to the surface of the member; and wherein the fastening part maintains the position of the optical module in a direction orthogonal to the plane.

\* \* \* \* \*